United States Patent [19]

Bailey et al.

[11] Patent Number: 4,789,852

[45] Date of Patent: Dec. 6, 1988

[54] METHOD AND APPARATUS FOR CONVERTING DATA IN A BINARY FORMAT

[76] Inventors: Guy R. Bailey; Angel F. Bailey, both of 602 Twin Brook Pkwy., Rockville, Md. 20851

[21] Appl. No.: 58,823

[22] Filed: Jun. 5, 1987

[51] Int. Cl.[4] .............................................. H03M 7/00
[52] U.S. Cl. ..................................................... 341/50
[58] Field of Search ................................. 340/347 DD

[56] References Cited

U.S. PATENT DOCUMENTS

| | | | |
|---|---|---|---|
| 3,440,646 | 4/1969 | Dean | 340/347 DD |
| 3,631,455 | 12/1969 | Gregg, Jr. | 340/347 DD |
| 3,750,147 | 7/1973 | Gregg | 340/347 DD |
| 4,506,252 | 3/1985 | Jacoby et al. | 340/347 DD |

OTHER PUBLICATIONS

*Analytical Chemistry,* "Low Cost Parallel-to-Serial Converter for Digital Instrumentation", vol. 43, No. 3, Mar. 1971, pp. 493–495.
*Radio-Electronics,* "Baudot to ASCII", Roger L. Smith, Apr. 1976, pp. 57–.
*Computer Design,* "Binary/BCD-to-ASCII Data Converter", Nov. 1977, p. 110.
"Gray Code to True Binary Bode Converter", T. J. Hennessey, vol. 3, No. 10, Mar. 1961.
"A Converter for Binary Coded Decimal to Binary Numbers", R. C. Camp, vol. 2, No. 6, Apr. 1960.

*Primary Examiner*—William M. Shoop, Jr.
*Assistant Examiner*—Richard K. Blum
*Attorney, Agent, or Firm*—Larson and Larson

[57] ABSTRACT

A method and apparatus for converting data in a pure binary format into a format that is transparent to a data handling system that utilizes the International Telegraphers Alphabet No. 5 (ITA 5), or the American subset thereof, the American Standard Code for Information Exchange (ASCII). The apparatus according to a specific embodiment of the present invention includes a 4 byte input register that has a parallel output, a 5 byte output register that has a parallel input and encode logic connected between the two registers. The input logic either directly connects or maps the output from the bits of the input bytes to corresponding positions in the bits of the first four output bytes, converts the data of other bits in the input bytes, or maps the bits of the input bytes into the 5th byte of the output word.

The Method according to a specific embodiment of the present invention encodes data in an 8 bit byte of pure binary into the 7 bit code of the ASCII format such that only printable, and hence transparent ASCII characters are produced. The method generates five 8 bit bytes of code for every four 8 bit bytes of data by mapping the parity bits of the data into the 5th byte, testing bit positions 6 and 7 of each byte to ascertain whether they are both zeros and if so setting and mapping an indicator bit into the 5th byte for every pair of tested bytes and inverting those bits and swapping 1 bit of each of the two bytes, and then storing the manipulated bits in corresponding locations in the output word, and then finally setting the value of one or both bits 6 and 7 in the 5th byte of the output word to ensure the 5th byte is not a control character.

16 Claims, 8 Drawing Sheets

METHOD AND APPARATUS FOR CONVERTING DATA IN A BINARY FORMAT

FIELD OF THE INVENTION

The present invention relates to data transmission systems, and in particular relates to a method and apparatus for conversion between data in a binary format to data in a convention format for use in systems that require such a format. More particularly, the present invention relates to a conversion system that manipulates data for transportation through a data handling system which utilizes the International Telegraphers Alphabet #5 format (ITA 5) and then converts that data back to the binary format when it must be used.

DESCRIPTION OF THE PRIOR ART

Various codes are used in today's automated data processing equipment and data communications equipment. By far, the most popular code is the International Telegraphers Alphabet #5, which has national versions as a subset. For example, the United States' version is more popularly known as the American Standard Code for Information Interchange (well known by its acronym, ASCII). The ASCII code is a seven bit code with an eighth bit normally reserved for a parity check bit of an 8 bit code element. This code contains 128 possible units of which 32 are commonly reserved for control codes such as device control, block control, message control, and file demarcation and forms control. The remaining 96 units or characters are called printable characters. The printable characters can pass through all of the data processing equipment and data communications equipment without affecting the operation of that equipment. On the other hand, the control codes will usually affect the operation of the equipment. In ITA #5, the first 32 codes which occupy the lower numbered locations, are the control codes. Thus, in an 8 bit byte where the 8th bit is always the parity bit, the 7th and 6th bits of the binary numbers from 0 through 31 both are 0. Stated the other way, all control codes in the ITA #5 format have 0's in bit positions 6 and 7 of an 8 bit byte.

Therefore, to transfer pure data transparently through a code sensitive system, e.g., a system that tests for 0's in bit positions 6 and 7, those elements that the system finds offensive must first be removed if pure data is to be transported. Furthermore, the most significant bit (MSB), i.e., the 8th bit, is a parity bit in these systems. This means that the 8th bit is either a 1 or a 0 such that when added to the value of the other 7 bits the result is either an even number for even parity systems or an odd number for odd parity systems. On the other hand, in pure binary data the value of the 8th bit has no relationship to the value of the other 7 bits.

Thus, a method is needed for converting the pure data numbers into codes that can be transparently transpoted by data handling systems that are control and parity sensitive. Obviously, once the data has been transported by that system, it must be reconverted if it is to be usable data.

Current methods of performing this function include utilizing translation or look-up tables, translating each code element of data into two hexadecimal code elements in the code employed (which has a high overhead), or testing the 8th bit and adding a special prefix to codes that might cause problems which results in variable length blocks. In this latter approach utilized by the IBM system known as "BISYNC," the prefix is required to prefix itself if that prefix appears normally in the code.

Examples of some prior art systems are disclosed in the following references.

In one published article, A. Miller, Computer Design, November 1977, page 110, a binary/BCD to ASCII converter is disclosed. This converter converts 32 bits of binary or Binary Coded Decimal data into 80 bits of ASCII data. The hardware includes adders with associated shift registers.

In another article, Janshorbani et al, 43 Analytical Chemistry, No. 3, (March 1971) entitled Low Cost Parallel-To-Serial Converter For Digital Instrumentation, a method and apparatus is disclosed for converting from parallel BCD data to serial ASCII data. The BCD data is transmitted in parallel to a hard wired "digit selector" which allows each digit to be "processed" one digit at a time. An extra BCD 4 bit output is added to generate an ASCII blank space. The data available at the first digit position (i.e, the four binary bits) is fed to the inputs of a 12 bit shift register which does the conversion. In essence, a 12 bit ASCII representation is packed with only 4 bits representing the data. Thus, by using 12 bits in the converted word to represent 4 bits in the data word, the system has a 200% overhead In an article by Camp, entitled Converter For Binary Coded Decimal To Binary Numbers, Volume 2, No. 6, IBM Technical Bulletin, page 46, (April 1960), an apparatus for parallel conversion from BCD data to binary is disclosed. The data is gated out in parallel from an input register and applied to a plurality of full adders. The output from the full adders is buffered and transmitted to half adders, and the output therefrom is transmitted to an output register. One bit, the Least Significant (LSB) is directly hard wired from the input register to the output register.

Another article discloses a method and apparatus for converting from Gray Code to binary using AND, OR, and Inverter Gates. The bits are complemented as necessary depending upon the value of related bits to make the conversion. Hennessey, Gray Code To True Binary Code Converter, Volume 3, No. 10, IBM Technical Bulletin, page 49 (March 1961).

The foregoing articles disclose methods and apparatus which actually make a data conversion so that the intelligence in one form is usable as intelligence in another form. These references all utilize hardware logic elements to make the conversions. Several patents and one article disclose the use of look-up tables together with some logic hardware elements to make the conversions.

For example, U.S. Pat. No. 3,750,147 to Gregg discloses a method and apparatus for converting from an ASCII code format to a video display code format. The conversion is accomplished by comparing the incoming code to one of several code formats contained in a "dictionary" or look-up table. Another Gregg U.S. Pat. No. 3,631,455, discloses a similar apparatus and method. The Dean U.S. Pat. No. 3,440,646 is slightly different, but still uses the same comparison and match technique. A fourth example of the use of a look-up table to make the conversion is disclosed in the article by Smith entitled "Baudot To ASCII," April 1986, Radio-Electronics, page 57.

All of the foregoing methods and apparatus suffer from either a great deal of overhead, or an indefinite amount of overhead which provides for blocks of data having an unknown length Those methods and apparatus utilizing look-up tables (also called vector mapping) are quite cumbersome, and require a great deal of processing.

There is thus needed a method and apparatus for converting pure binary data into a format that can be transparently handled by various data handling systems. One such data handling system is a conventional editor used in a digital computer which operates utilizing the ASCII format. Obviously, pure binary data may contain zeros in the 6th and 7th bit positions which would then be interpreted by the editor as being a control character. Furthermore, the editor would check the 8th bit to ensure that the parity is proper, and in a pure binary data number, the 8th bit position has no relationship to the other 7 bits.

A conversion system is also needed in which the overhead and the conversion time is minimized. The overhead can be defined as the percentage of the extra data bits added to the converted word compared to the original number of data bits. The overhead is particularly important when the data must be stored, such as in an electronic mail storage system in which fees are charged for the number of storage blocks taken. In addition, in communication systems a greater overhead will mean a greater time needed to transmit the converted data

SUMMARY OF THE INVENTION

The present invention fulfills these needs with a relatively uncomplicated, highly versatile, very fast and relatively inexpensive method and apparatus. The present invention utilizes a fixed format with a low overhead (the number of converted output bits divided by the number of input bits).

In addition, the present system permits the use of an 8th bit as a check bit or parity bit. As a result, the present system can work with a higher actual error rate. For example, in a conventional XMODEM sensitive system, the system will show excessive undetected errors with an actual error rate of one in a thousand, whereas the system according to the present invention can work with an error rate of one error in a hundred. In a preferred embodiment of the present system in which binary data or binary coded decimal data is converted to an ASCII format, the overhead is only 25 percent compared with 100 and 200 percent common in the prior art.

According to the present invention, apparatus is disclosed for converting a block of input words of binary input bytes into a block of output words of converted data having a predetermined format. As used herein, the term "word" means one or more multi bit bytes and can have for example, one, two or four bytes per word depending upon the particular data system. Usually, although it is not mandatory, a byte is comprised of 8 binary bits. The input words have a predetermined number of binary bits and the output words also have a predetermined number of output bits. The apparatus comprises an input register, an output register, and a logic means. The input register has a parallel output and a size or length of at least 2 input bytes. The output register has a parallel input and has a size or length of at least 2 input bytes. The logic means is connected between the input and output registers and is for transferring unchanged the information in predetermined input bits in a predetermined order to a first group of predetermined output bits in the output words. The logic means is also for converting the information in other predetermined input bits and transferring the converted information in a predetermined order to a second group of predetermined output bits in the output words. The second group of bits are different from the first group.

In a specific embodiment of an apparatus according to the present invention that is used for converting a block of a predetermined number of input words of binary input bits into a block of output words, the number of output words is greater than the number of input words and the size of each input word is fixed and equal to the size of each output word. The apparatus comprises an input register, an output register, and a logic means connected between the two registers. The input register has a size of at least two input words and the output register has a size of at least three input words. The logic means maps the information of predetermined input bits into corresponding predetermined output bits. The logic means also converts the information in other input bits and transfers the converted information in a predetermined order to another group of predetermined output bits. The logic means further maps at least one bit from each input word into the additional output word.

A method according to the present invention comprises converting an input word of binary data into an output word of converted data wherein the input word is comprised of at least two multibit input bytes which in turn are comprised of a predetermined number of input bits and wherein the output word is comprised of at least two multibit output bytes which in turn are comprised of a predetermined number of output bits. The method comprises storing an input word into an input register that has a parallel output. The method then automatically transfers unchanged in parallel the information of a group of predetermined input bits in a predetermined order to a first group of predetermined output bits of an output word that is stored in an output register having a parallel input. Then the information of a second group of predetermined input bits which are different from said first group of input bits are tested and if the information is of a predetermined value, the information is converted to a different value. The method then transfers either the second group of input bits, or if a conversion has been done, transferring the converted value of the second group of input bits in a predetermined order to a second group of predetermined output bits in the output register.

In a particular embodiment of a method according to the present invention, in which a conversion of 8 bit bytes of binary formated data are converted to 8 bit bytes of ITA #5 data format, the method comprises storing at least two bytes of data in an input register having a parallel output. Then, a predetermined number of least significant bits are mapped, unchanged, into corresponding positions in an output register having a length of at least 3 output bytes. A predetermined number of higher order bits from each input byte are mapped, unconverted, into predetermined bits of a third byte in the output register. Other higher order bits of the two input bytes are tested and if the value of those tested bits is a predetermined value, the information in these bits is converted and stored in the third byte of the output register.

These and other aspects, advantages and features of the present invention will be set forth in or apparent from the detailed description of the present invention contained hereinbelow.

DETAILED DESCRIPTION OF THE PREFERRED EMBODIMENT

Figure 1:
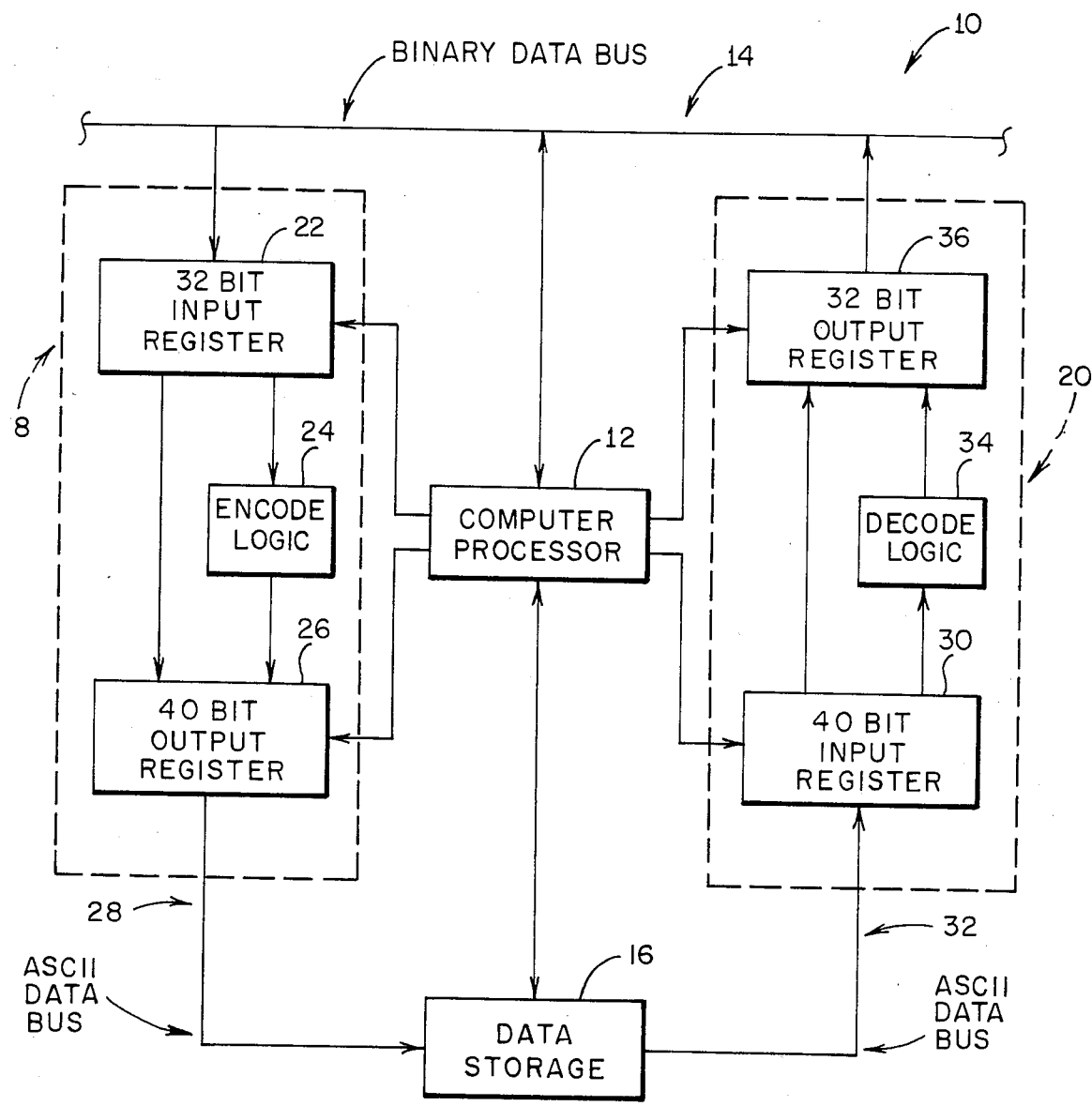
FIG. 1 is a schematic block system diagram of apparatus for converting four 8 bit bytes of binary data into five 8 bit bytes of ASCII formatted data, for storing the ASCII data, and for reconverting the data back into four 8 bit bytes of binary data.

With reference now to the figures wherein like numerals depict like elements in the several figures, conversion apparatus and process is disclosed that is transparent for ITA #5 sensitive media having a fixed overhead. With reference in particular to FIG. 1, a data processing system, such as a word processing system 10 is depicted. System 10 is comprised of a computer processor 12 that controls the system and receives and transmits binary data from and to a binary data bus 14 as well as a data storage 16. Data storage 16 can be any conventional storage means such as a hard disk, floppy disk, or even mass data storage devices such as those that are used with electronic mail storage. The hardware depicted in FIG. 1 contemplates that the present invention can be implemented either by computer software controlling computer processor 12 or by hardware components such as those disclosed in a data conversion subsystem 18 and a data reconversion subsystem 20.

Binary data bus 14 transmits and receives true binary data in the format of 8 bit bytes that can be arranged in one byte, two byte, or four byte words. In all respects, the data appearing on data bus 14 and the configuration of data bus 14 itself is conventional. Preferably, however, data bus 14 is a parallel data bus although a serial data bus could work equally as well with the present invention.

Data conversion subsystem 18 is comprised of a 32 bit input register 22. Assuming that data bus 14 is a parallel data bus, register 22 is a parallel input, parallel output register. Again, however, register 22 could also be a serial-in-parallel-out register. In any event, the data is latched into register 22 by commands from computer processor 12. Some of the output bits from register 22 are fed to an encode logic 24, and other, different output bits from register 22 are directly connected to corresponding bits in a 40 bit output register 26. The remaining output bits from register 22 are connected to form part of a fifth 8 bit byte in output register 26. Encode logic 24 is described in greater detail with respect to FIG. 3. Output register 26 is a conventional parallel-in register that is preferably a parallel-out register as well. However, register 26 can also include five banks of 8 tristate buffers that are sequentially latched by computer processor 12. The output from output register 26 is connected through an ASCII data bus 28 to data storage 16. Thus, if ASCII data bus 28 is an 8 bit bus, then banks of tristate buffers would have to be multiplexed by computer processor 12 in order to sequentially store the converted data contained in output register 26 in data storage 16.

Reconversion subsystem 20 is substantially the inverse of conversion subsystem 18. A 40 bit input register 30, arranged into five 8 bit bytes is connected by an ASCII data bus 30 to data storage 16 to receive data therefrom. Preferably, although not mandatory, ASCII data bus 32 has the same format as ASCII data bus 28. Computer processor 12 is connected to both data storage 16 and input register 30 so as to control the selection, transmission and receipt of converted data stored in data storage 16 into input regiseer 30. As mentioned above, if ASCII data bus 32 is less than 40 bits wide, then computer processor 12 is also used to multiplex the data out of data storage 16 and into the appropriate locations of input register 30.

Input register 30 is a parallel-out and preferably parallel-in conventional register. In fact, input register 30 could be the same type of register as output register 26, described hereinabove. In an alternative embodiment, input register 30 and output register 26 could be the same register. Some of the outputs from the bits of input register 30 are connnected to a decode logic 34, and other of the outputs are connected to the input of a parallel-in 32 bit output register 36. The remaining outputs of the 40 bit input register are not used in the reconversion, as described in greater detail hereinbelow.

Output register 36 is the same type of register as input register 22. As with registers 26 and 30, registers 22 and 36 can in another embodiment be the same register.

Figure 2:
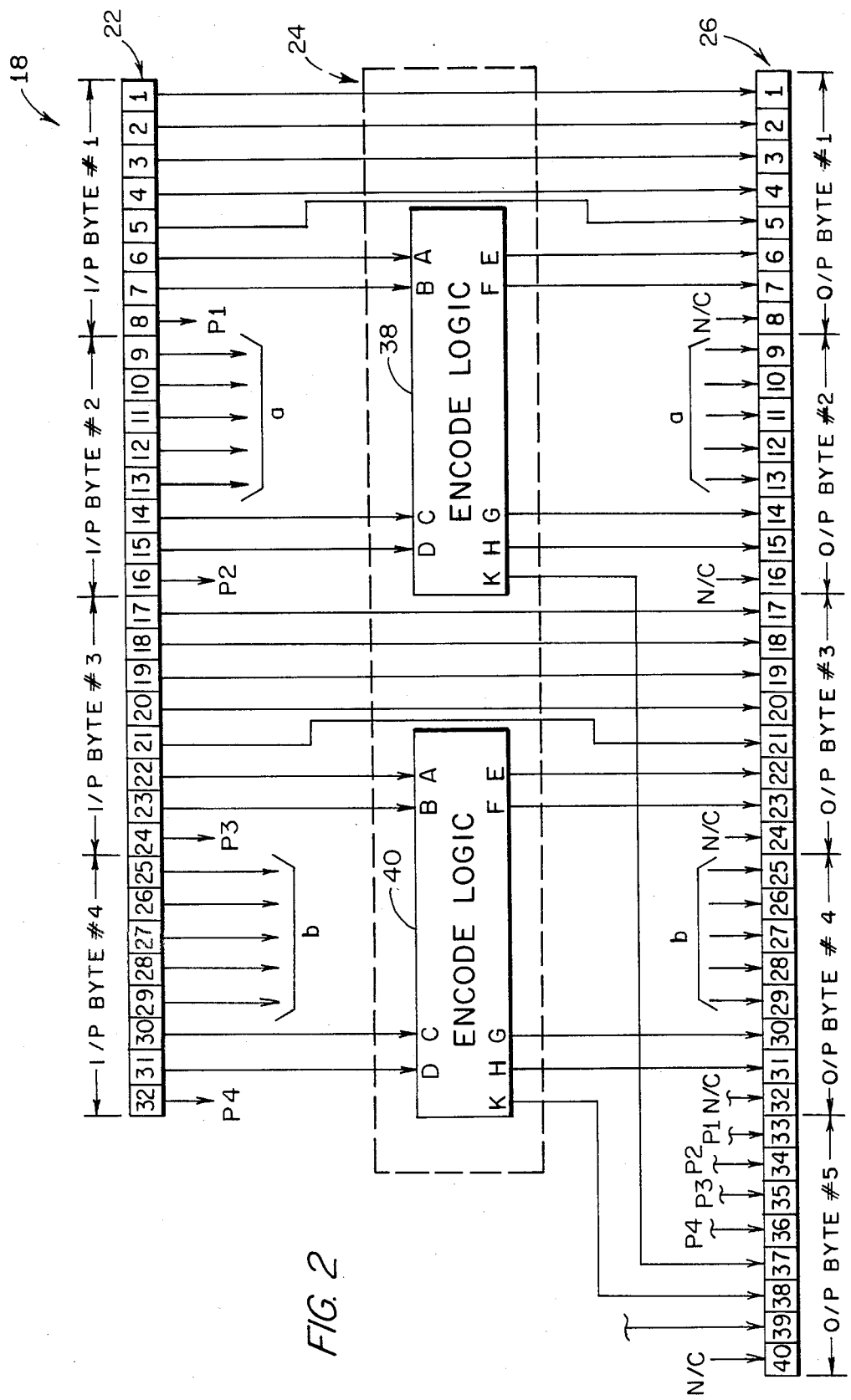
FIG. 2 is a schematic block circuit diagram of the conversion part of the invention depicted in FIG. 1.

With reference now to FIG. 2, input register 22 is depicted as containing 32 parallel output stages, number sequentially, which are arranged into four eight bit input bytes numbers 1 through 4. Similarly, output register 26 is depicted as containing 40 individual parallel input stages which are individually numbered from 1 through 40. The stages of output register 26 are also arranged into five eight bit output bytes labeled 1 through 5. The first five least significant bits of input bytes 1, 2, 3 and 4 are directly connected (i.e., hard wired) to corresponding and similarily numbered bits in the first four output bytes of output register 26. Thus, for examples, bits 1 and 2 of input byte number 1 and 9 and 10 of input byte number 2 are directly, respectively, connected to bits 1 and 2 of output byte number 1 and bits 9 and 10 of output byte number 2. Stated more comprehensively, bits 1 through 5, 9 throught 13, 17 through 21 and 25 through 29 of input register 22 are directly, respectively, connected to bytes 1 through 5, 9 through 13, 17 through 22 and 25 through 29 of output register 26.

Encode logic 24 of FIG. 1 is depicted in FIG. 2 as being comprised of two identical encode logics 38 and 40. Encode logic 38 and 40 have four inputs, denoted A, B, C and D and have five outputs denoted E, F, G, H and K. As described in greater detail hereinbelow with respect to FIG. 3, encode logic 38 essentially maps the information contained in byte 6 and 7 and 14 and 15 of input register 22, or a conversion thereof, into bytes 6 and 7 and 14 and 15 of output register 26. A code bit K is generated by encode logic 38 to indicate whether the actual data contained in bit 6 and 7 and 14 and 15 of input register 22 or a conversion thereof are stored in the corresponding bits of output register 26.

Encode logic 40 is connected in a similar fashion as encode logic 38.

The most significant bit of each input byte 1, 2, 3 and 4 of input register 22, namely bit 8, 16, 24 and 32, are directly mapped into a fifth output byte of output register 26. In the embodiment depicted in FIG. 2, the most significant bits are stored in the same order as they appear in input register 22 in bits 33, 34, 35 and 36 of output register 26. The output codes K from encode logic 38 and 40 are mapped directly to bits 37 and 38 of output byte number 5 of output register 26. Stated another way, the most significant bits of the four input bytes of register 22 are mapped into the first four bits of the added fifth output byte of output register 26 and the two code bits from encode logics 38 and 40 are stored in the fifth and sixth bit of the added fifth output byte of output register 26.

The most significant bit (MSB) of each of the output bytes of register 26 are "no care" bits and can be either tied to ground, to system voltage or can be connected to a parity generator. The parity generator can be a conventional device or can be a software implementation and use a computer processor 12. In that case, there are two possibilities for utilizing the embodiment as depicted in FIG. 1. In a first embodiment, a computer compressor 12 can access each of the bytes of register 26, calculate the most significant bit using the desired parity and supply that bit, and then restore the word to register 26. Alternatively, computer processor 12 can cause the 5 output bytes of register 26 to be stored in data storage 16, then access each byte in turn and calculate the parity bit, supply the parity bit and restore the byte into data storage 16. In any event, for the purposes of the present invention the MSB of each output byte is identified as a "no care" bit.

Figure 3:
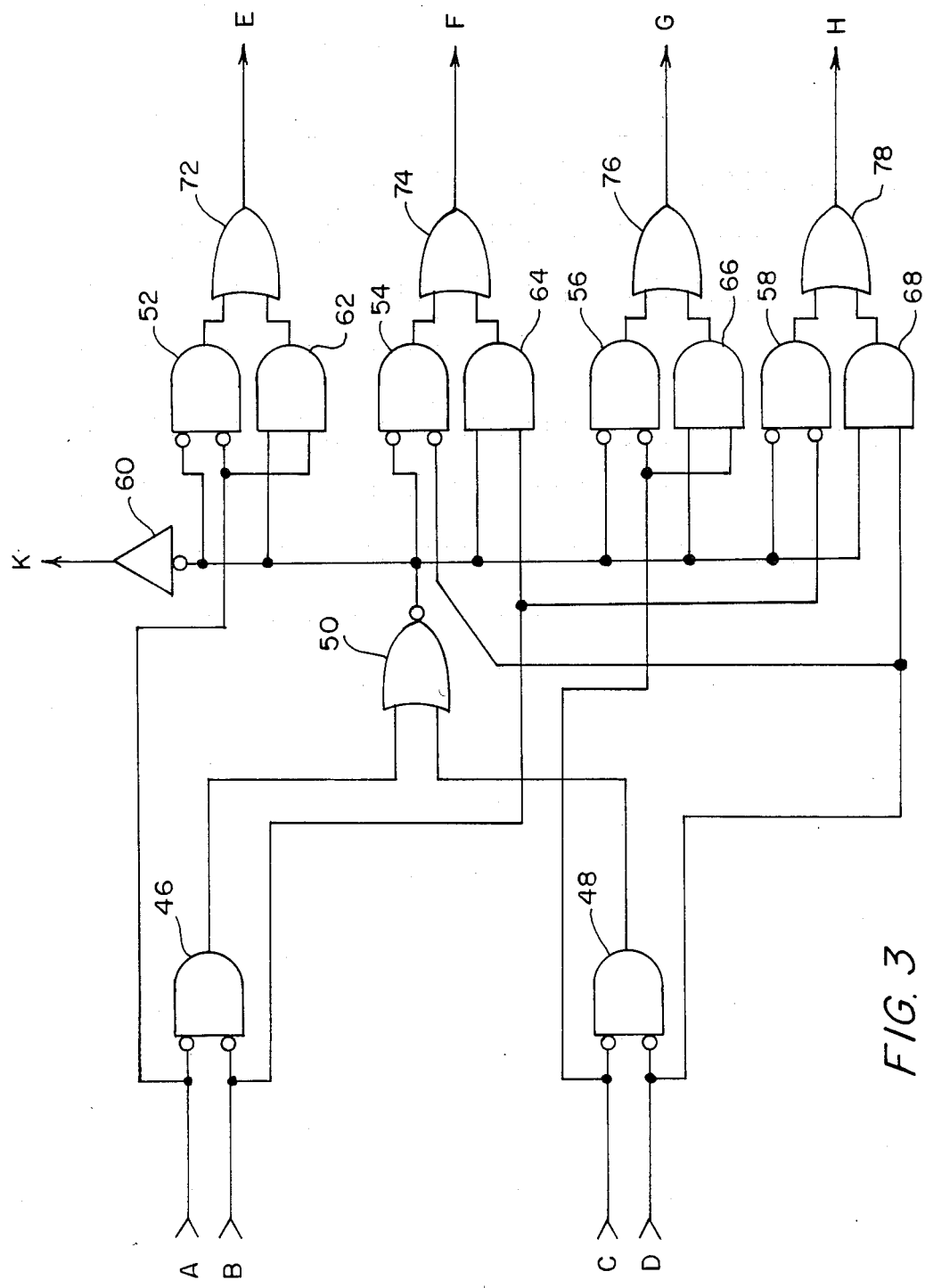
FIG. 3 is a schematic circuit diagram depicting the encode logic circuitry of FIGS. 1 and 2.

With reference now to FIG. 3 the schematic circuitry of encode logics 38 and 40, which is stated above, are identical is depicted in FIG. 3. The A and B, and the C and D inputs are connected to two NOR gates 46 and 48, depicted in FIG. 3 for easier logic flow as being inverted input AND gates. The ouput from gates 46 and 48 are connected to the input of a second level NOR gate 50. The output from gate 54 is coupled to an enabling input of four third level NOR gates, also depicted as inverted input AND gates 52, 54, 56 and 58. The output from second level NOR gate 50 is also connected to the inverted input of an inverter 60, the output of which produces output K from encode logic 38. Finally, the output from second level NOR gate 50 is also connected to the enable input of four third level AND gates 62, 64, 66, and 68. Gates 52, 54, 56 and 58 are respectively paired with gate 62, 64, 66 and 68 by connecting the corresponding outputs from each pair to the two inputs of a two input, fourth level OR gates 72, 74, 76, and 78. The output from OR gate 72, 74, 76 and 78 respectfully provide encode logic outputs E, F, G and H.

The data inputs to gate pairs 52 and 62 are directly connected to encode logic input A so that either the actual value of input A or the inverted value of input A is provided a output E, depending upon the enabled output of gate 50. Similarly, the data input of gates 56 and 66 are connected to encode logic input C. Thus, encode logic G is either input C or inversion thereof.

On the other hand, the data inputs of the remaining two pairs of gates, namely third level gates 54 and 64 and 58 and 68 are either the actual encode logic input B and D, respectively, or the versions thereof which are then inverted by gates 54 and 58. In other words, encode logic outputs F and H are either the actual inputs B and D respectively or the inversions of input D and B, respectively.

The encode logic elements of FIG. 3, as described hereinabove are connected to provide the following logic. If either both the encode logic inputs A and B or encode logic inputs C and D are zeros, the corresponding gates 48 and 50 are driven to a logical 1 and thus the output from gate 50 is driven to a logical zero. The logical zero from gate 50, in turn, forces the output "K" from inverter 60, denoted the indicator output, to a logical 1. This enables the fifty series third level gates 52, 54, 56 and 58, and simultaneously disables the sixty series, third level gates 62, 64, 66 and 68. This forces the inversion of all inputs and the routing of inputs A, B, C and D to outputs E, H, G, and F, respectively. On the other hand, if both inputs A and B are not both zero and both inputs C and D are not both zero, then the sixty series third level gates are enabled and the fifty series third level gates are disabled. This provides a normal, non-inverted and non-swapped routing of inputs A, B, C and D to, respectively, ouotputs E, F, G, and H. This logic is shown in Table 1.

TABLE 1

| INPUT | | | | Gate 50 Output | 50 Series Gates | 60 Series Gates | OUTPUTS | | | | |
|---|---|---|---|---|---|---|---|---|---|---|---|
| A | B | C | D | | | | K | E | F | G | H |
| 0 | 0 | X | X | 0 | enabled | disabled | 1 | 1 | $\bar{D}$ | $\bar{C}$ | 1 |
| 0 | 0 | 0 | 0 | 0 | " | " | 1 | 1 | 1 | 1 | 1 |
| 0 | 0 | 0 | 1 | 0 | " | " | 1 | 1 | 0 | 1 | 1 |
| 0 | 0 | 1 | 0 | 0 | " | " | 1 | 1 | 1 | 0 | 1 |
| 0 | 0 | 1 | 1 | 0 | " | " | 1 | $\underline{1}$ | 0 | 0 | $\underline{1}$ |
| X | X | 0 | 0 | 0 | " | " | 1 | $\bar{A}$ | 1 | 1 | $\bar{B}$ |
| 0 | 1 | 0 | 0 | 0 | " | " | 1 | 1 | 1 | 1 | 0 |
| 1 | 0 | 0 | 0 | 0 | " | " | 1 | 0 | 1 | 1 | 1 |
| 1 | 1 | 0 | 0 | 0 | " | " | 1 | 0 | 1 | 1 | 0 |
| 0 | 1 | 0 | 1 | 1 | disabled | enabled | 0 | 0 | 1 | 0 | 1 |
| 0 | 1 | 1 | 0 | 1 | " | " | 0 | 0 | 1 | 1 | 0 |
| 0 | 1 | 1 | 1 | 1 | " | " | 0 | 0 | 1 | 1 | 1 |
| 1 | 0 | 0 | 1 | 1 | " | " | 0 | 1 | 0 | 0 | 1 |
| 1 | 0 | 1 | 0 | 1 | " | " | 0 | 1 | 0 | 1 | 0 |
| 1 | 0 | 1 | 1 | 1 | " | " | 0 | 1 | 0 | 1 | 1 |
| 1 | 1 | 0 | 1 | 1 | " | " | 0 | 1 | 1 | 0 | 1 |
| 1 | 1 | 1 | 0 | 1 | " | " | 0 | 1 | 1 | 1 | 0 |
| 1 | 1 | 1 | 1 | 1 | " | " | 0 | 1 | 1 | 1 | 1 |

'X' means a "don't care" value;
'$\bar{A}$', etc. means the inverse value of 'A'.

Figure 4:
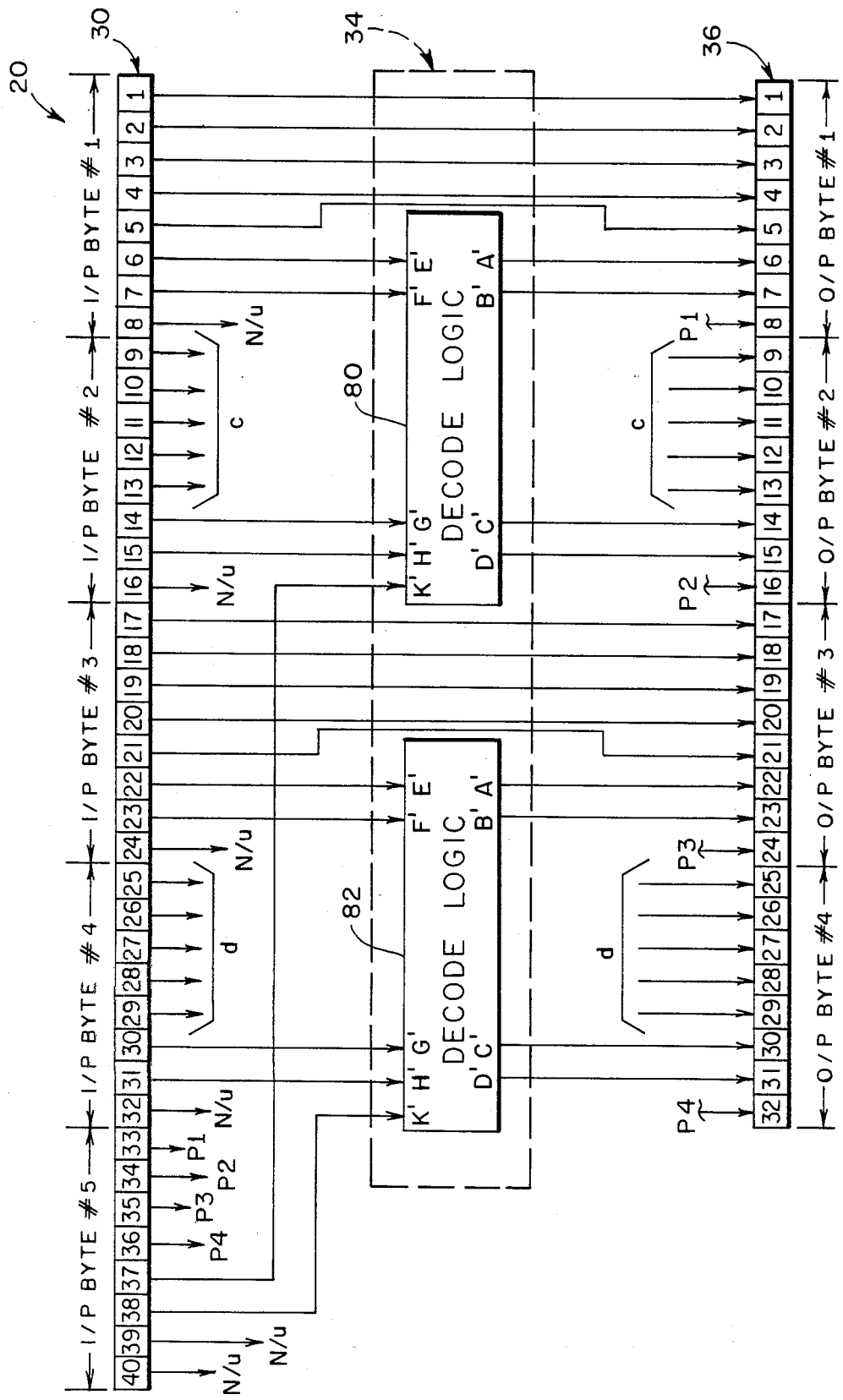
FIG. 4 is a schematic block circuit diagram of the reconversion part of the invention depicted in FIG. 1.

It can thus be seen that the encode logic is comprised of a 32 bit binary input data register that can be loaded in either a serial or parallel fashion and which provides specific outputs to two 16 bit encode logic circuits and to an output register that is larger than the input register. All bits of the input register are either used by the encode logic or are passed unchanged through the encode logic and are mapped to specific bits in the output register on a one-to-one basis. Those bits that are tested and perhaps manipulated by the encode logic are mapped into the added byte in the output register along with the eighth bits of each of the input bytes, which are indicated in the drawings as bits P1, P2, P3, and P4. As a result of this mapping, it is assured that at least one of each pair of bits 6 and 7, 14 and 15, 22 and 23, 30 and 31 is a logical 1. Furthermore, bit number 39 of output register 26 is tied high to guarantee that the fifth, added byte in output register 26 also has at least a logical 1 in bit positions 6 or 7. In this manner every byte in output register 26 will be guaranteed to be comprised of ITA number 5 printable code elements. The eighth bit of each of the five bytes of output register 26, namely bits 8, 16, 24, 32 and 40 are available to later processes to insert parity or other coding as desired. With reference now to FIG. 4, the data reconversion subsystem 20 will now be described in greater detail. As mentioned above, subsystem 20 is comprised of 40 bit input register 30 having a parallel output, a 32 bit output register 36 having a parallel input, and decode logic 34. Also, as mentioned above, input register 30 can be either a parallel input, a serial input or a combination of the two whereby each of the five input bytes are serially loaded but each eight bit byte is loaded in parallel. Decode logic 34 is comprised of two substantially identical logic circuits 80 and 82, described in greater detail hereinbelow with respect to FIG. 5.

Input register 30 has a length so as to accomodate the encoded word, which in the described embodiment is comprised of five eight bit bytes. Output register 36 has a length so as to accomodate the decoded word that is comprised of four eight bit bytes. The parallel outputs from the first five bits of the first four input bytes of input register 30 are directly connected to corresponding inputs of the first five bits of the output bytes in output register 36. Thus, the outputs from bits 1 through 5, 9 through 13, 17 through 21 and 25 through 29 of input register 30 are directly connected to the inputs of bits 1 through 5, 9 through 14, 17 through 21 and 25 through 29 of output register 36. The output from the sixth and seventh bit positions of the first four input bytes of input register 30 are connected in sets of two to decode logic circuits 80 and 82. Thus, the outputs from bits 6 and 7 and 14 and 15 are respectively connected to input E' and F' and G' and H' of decode logic circuit 80, and the output from bit 22 and 23 and 30 and 31 are respectively connected to inputs E' and F' and G' and H' of decode logic circuit 82. The output from the eighth bit of each of the first four input bytes of input register 30 are not used.

As mentioned above, the data contained in input byte number 5 of input register 30 holds the eighth bit of the four bytes of data that was encoded as well as indicator outputs used by the corresponding decode logic circuits 80 and 82. Thus, the outputs from bits 33, 34 and 36, designated P1, P2, P3 and P4 of input register 30 are directly connected to the eighth bit position of the corresponding output bytes in output register 36. Thus, P1, P2, P3 and P4 are respectively connected to the inputs of bits 8, 16, 24 and 32 of output register 36. The outputs from bits 37 and 38, namely the fifth and sixth of input byte number 5 of input register 30 are connected, respectively, to the K' input of decode logic circuits 80 and 82. The outputs from bits 39 and 40 of input register 30 are not used.

Figure 5:
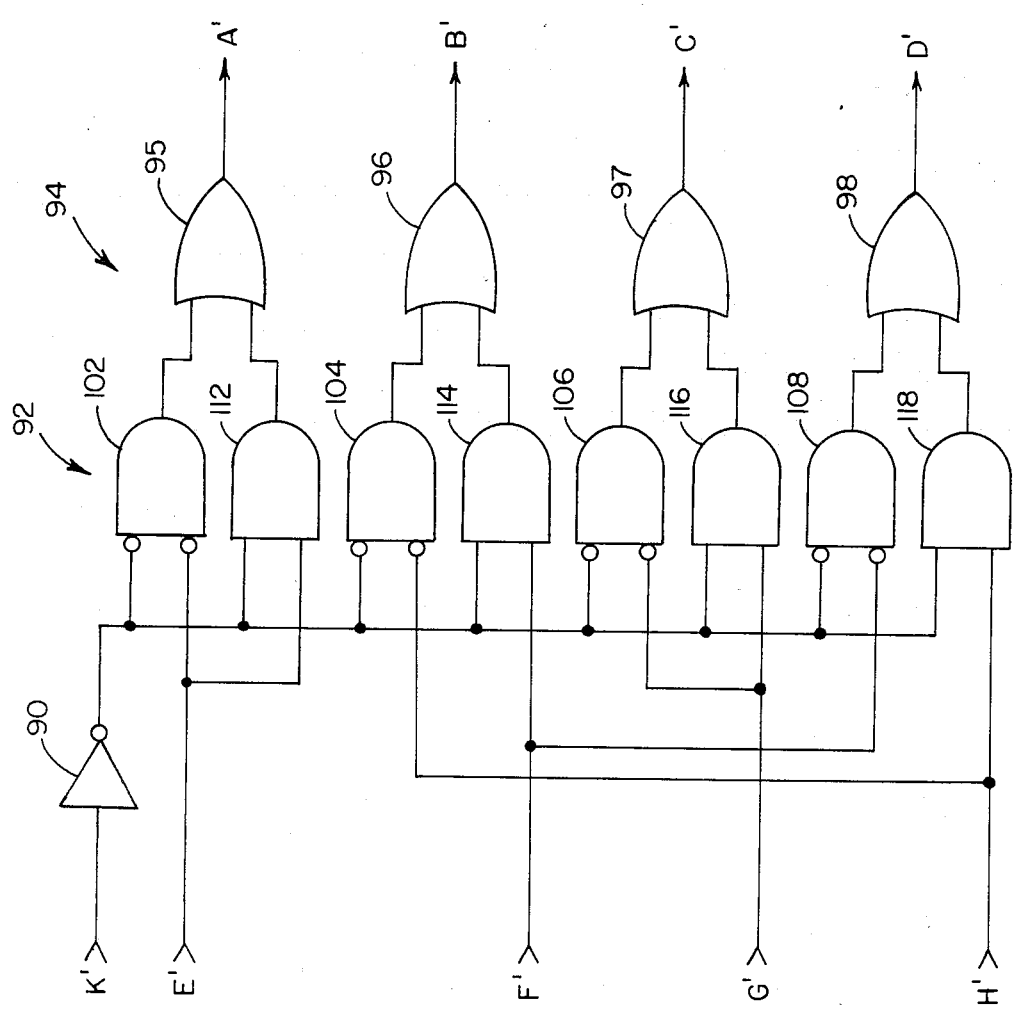
FIG. 5 is a schematic circuit diagram depicting the decode logic circuitry of FIGS. 1 and 4

With reference now to FIG. 5, the circuitry is depicted for the decode logic circuits 80 and 82 of FIG. 4, which as mentioned above, are the same. The K' input is fed to a first level inverter, 90 and to the enable 65 inputs of a bank of second level gates 92, the outputs of which are taken, two at a time, as inputs to a bank 94 of two input OR gates 95, 96, 97 and 98. The output from gates 95, 96, 97 and 98 are respectively decode logic outputs A', B', C' and D'.

The gates of bank 92 provide the logic for rearranging the data bits taken from input bytes 1, 2, 3 and 4 stored in input register 30 of FIG. 4. Bank 92 is comprised of four NOR gates 102, 104, 106, and 108, shown drawn as inverting input AND gates. In addition, the other pairs of gates of bank 92 are two input AND gates 112, 114, 116 and 118. The outputs of gates 102 and 112, 104 and 114, 106 and 116, 108 and 118, are fed, respectively, to the input of OR gates 95, 96, 97 and 98, respectively. The data input of gates 102 and 112 are both connected to the E' input of the decode logic circuit. Thus, depending upon the input to inverter 90, either gate 102 or 112 will be enabled to provide, respectively, at logic circuit output A' the inverted input E' or the actual input E'. The data input of gates 104 and 118 are connected to the H' input to the decode logic circuit. On the other hand, the data inputs of gates 114 and 108 are connected to the F' to the decode logic circuits. Thus, pending again on the value of indicator bit K', the output from OR gates 96 and 98 will either be the actual value of the F' input or the inverted value of the H' input Generally, the output D' will either be the inverted value of input F' or the actual value of input H'. Finally, the data inputs to gates 106 and 116 are connected to decode logic circuit input G'. Thus, the C' output of the decode logic circuit is either the actual value of the G' input or its inverted value, again depending upon the value of the indicater K'. Table two shows the relationship between the various values of the inputs to the outputs of the decode logic circuit depicted in FIG. 5.

TABLE 2

| | | | | | | INTERMEDIATE GATES | | | | | |
|---|---|---|---|---|---|---|---|---|---|---|---|
| INPUTS | | | | | Inverter 90 Output | 100 Series Gates | 110 Series Gates | OUTPUTS | | | |
| K' | E' | F' | G' | H' | | | | A' | B' | C' | D' |
| 1 | 1 | 1 | 1 | 1 | 0 | enabled | disabled | 0 | 0 | 0 | 0 |
| 1 | 1 | 0 | 1 | 1 | 0 | " | " | 0 | 0 | 0 | 1 |
| 1 | 1 | 1 | 0 | 1 | 0 | " | " | 0 | 0 | 1 | 0 |
| 1 | 1 | 0 | 0 | 1 | 0 | " | " | 0 | 0 | 1 | 1 |
| 1 | 1 | 1 | 1 | 0 | 0 | " | " | 0 | 1 | 0 | 0 |
| 1 | 0 | 1 | 1 | 1 | 0 | " | " | 1 | 0 | 0 | 0 |
| 1 | 0 | 1 | 1 | 0 | 0 | " | " | 1 | 1 | 0 | 0 |
| 0 | 0 | 1 | 0 | 1 | 1 | disabled | enabled | 0 | 1 | 0 | 1 |
| 0 | 0 | 1 | 1 | 0 | 1 | " | " | 0 | 1 | 1 | 0 |
| 0 | 0 | 1 | 1 | 1 | 1 | " | " | 0 | 1 | 1 | 1 |
| 0 | 1 | 0 | 0 | 1 | 1 | " | " | 1 | 0 | 0 | 1 |
| 0 | 1 | 0 | 1 | 0 | 1 | " | " | 1 | 0 | 1 | 0 |
| 0 | 1 | 0 | 1 | 1 | 1 | " | " | 1 | 0 | 1 | 1 |
| 0 | 1 | 1 | 0 | 1 | 1 | " | " | 1 | 1 | 0 | 1 |
| 0 | 1 | 1 | 1 | 0 | 1 | " | " | 1 | 1 | 1 | 0 |
| 0 | 1 | 1 | 1 | 1 | 1 | " | " | 1 | 1 | 1 | 1 |

In the aforedescribed presently preferred embodiment, data processing system 10 utilizes computer processor 12 to control the operation of the system. Computer processor 12 can be any of a number of commerically available, general purpose digital computers, including microcomputers. For example, computer processor 12 can be a micro computer based on any one of the INTEL microprocessor chips 8080, 8088, or 8086 or the motorola microprocessor chips 6800 or 68000 series, as well as others. The programming of computer processor 12 is described hereinbelow with respect to FIG. 6, 7 and 8. As is well known in the art, the control functions can also be performed by custom designed logic.

The method of the present embodiment for converting four eight bit bytes of data into ASCII code format of the 96 printable codes tests the sixth and seventh bit position of two pairs of bytes and develops two additional bits of code data which are then mapped together with the four MSB bits into the first sixth bits of a fifth byte. Bit 7, as described above of the present embodiment is reserved as a "set bit" to ensure that the fifth byte is also in the form of a printable ASCII code.

The two additional bits of code, called above the indicator bit, is set equal to either a zero or a one depending upon whether the bits 6 and 7 of any byte are both zeros. See Table 1 above for examples.

According to the presently preferred method, the bytes of data are examined in pairs. If bit position 6 and 7 of either member of the pair are both zeros, then the values of all four bits are inverted. The bit seven of one of the pair of bytes is swapped with bit seven of the other member of the pair of bytes and the result is stored in the corresponding six and seven bit positions of the data bytes. As mentioned above, the developed indicator bit is mapped into the fifth code byte.

With reference now to Table 3, the development of the fifth byte will be explained. First, parity bits 1-8, 2-8 and 3-8 and 4-8 are mapped or distributed to position C-1, C-2, C-3 and C-4 irrespective of the value of those bytes and in the stated order or some other predetermined, but fixed. Then, bit group 1-6 and 1-7 and bit group 2-6 and 2-7 are examined and if one or both bit groups consist of all zeros, the following operation is preformed.

1. All four bits, namely bits 1-6, 1-7, 2-6 and 2-7 are inverted.

2. Then, one, and only one of the bits of the first group are swapped with one and only one of the bits of the second group. Thus, either bit 1-6 or bit 1-7 is swapped with either bit 2-6 or 2-7.

3. Finally, bit C-5 is set to a logical level 1 to indicate that the inversion and swapping has taken place.

The same operation is performed with bits 3-6 and 3-7 and 4-6 and 4-7 with the indicator bit being posted to position C-7.

The foregoing method works in all possible situations because bits 6 and 7 must both be zero if the character is a control character. The inversion and swapping ensure that both code elements of both pairs of bytes will have at least one bit each in either bit position 6 or 7 that is equal to a logical level 1. By assuring that both bit positions 6 and 7 are not logical level zeros, a resulting byte is assured of not being a control character. The eighth bit position of all of the bytes are either set to zero or are left to other operations to set a parity bit, as desired.

The present method results in a fixed length reversible process for converting four bytes of eight bit binary data to five bytes of seven bit ITA #5 code. By removing the eighth bit and converting any control characters, the resulting inverted byte is made transparent for the data handling systems.

Figure 6:
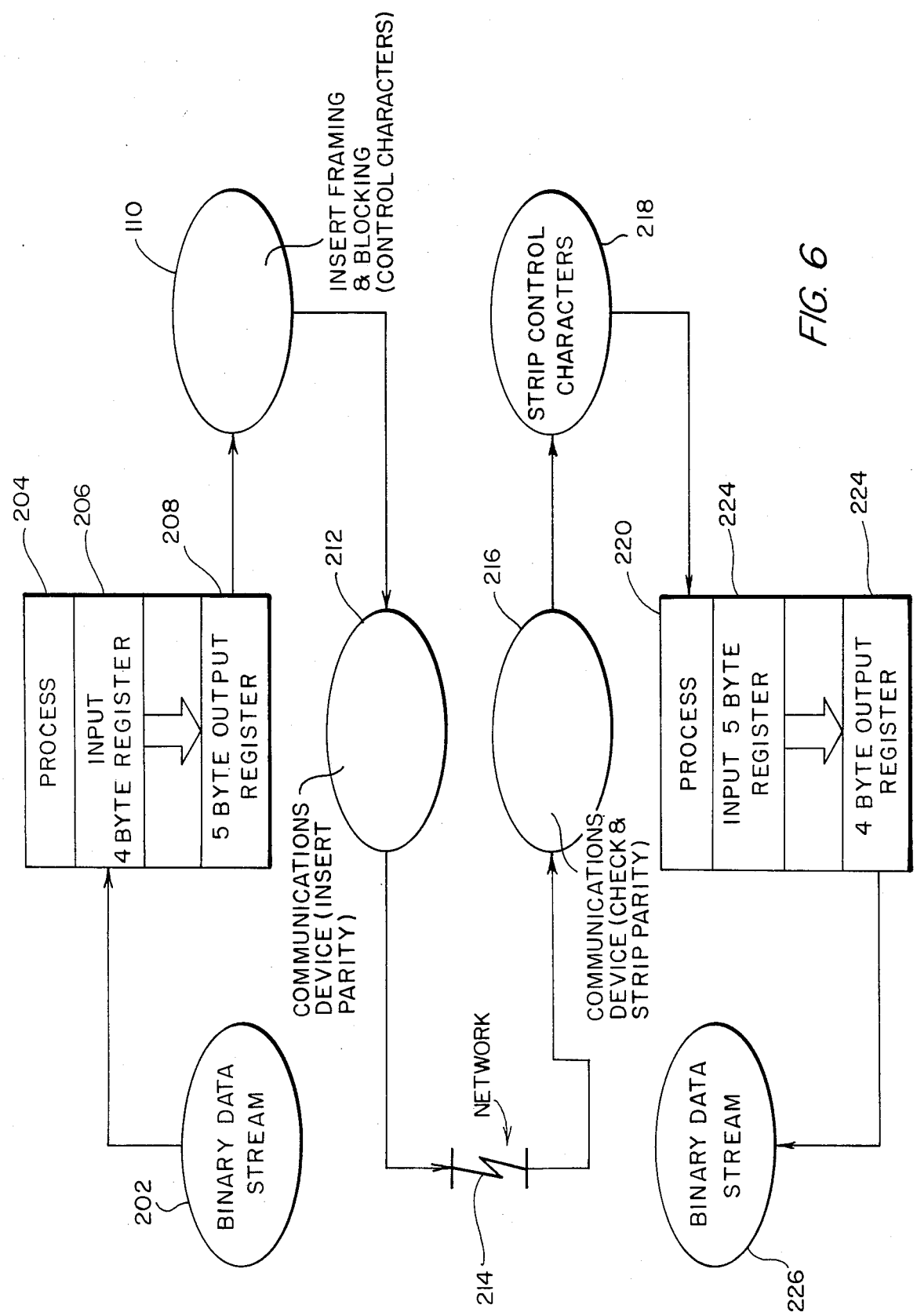
FIG. 6 is a system flow chart diagram depicting the method of the present invention utilized with a communications network.

With reference now to FIG. 6 the implementation of the method according to the present invention, is depicted with respect to a communications data handling network. A data stream, indicated to 202 is transported to a machine controlled processing box 204 where the data stream is broken up into four byte words and stored in an input register 206. The data is then converted or mapped as described hereinabove into a five byte output register 208 and transmitted from process box 204 where a machine controlled process as indicated in oval 210 inserts appropriate framing and blocking control characters. A process next proceeds to a communication device indicated to oval 212 where the appropriate parity is inserted into each byte at the eighth bit or the MSB position. The data is now ready to be communicated onto the network indicated at 214 by the communications device. The network can be as simple as a LAN (local area network), or can involve a radio telecommmunication network. Irrespective of the form of network 214 a further communications device 216 receives the transmitted data then performs conventional checks to ensure the accuracy of the received data. Communications device 216 then strips out the parity bits and transmits the processed data to appropriate data processing equipment, indicated at oval 218, where the control characters inserted at oval 110 are stripped out. The resulting stream of converted data is then sent to process box 220 where the data is reconverted, as explained above, back into the binary data format. Initially, the data is received by a five byte input register 222, and is processed with the processed data being stored in a four byte output register 224. From output register 224, the data is transmitted back into a binary data stream as indicated at oval 226.

TABLE 3

| Binary Data Bytes | | | | Added Byte |
| --- | --- | --- | --- | --- |
| 1-8 | 2-8 | 3-8 | 4-8 | C-8 |
| 1-7 | 2-7 | 3-7 | 4-7 | C-7 |
| 1-6 | 2-6 | 3-6 | 4-6 | C-6 |
| 1-5 | 2-5 | 3-5 | 4-5 | C-5 |
| 1-4 | 2-4 | 3-4 | 4-4 | C-4 |
| 1-3 | 2-3 | 3-3 | 4-3 | C-3 |
| 1-2 | 2-2 | 3-2 | 4-2 | C-2 |
| 1-1 | 2-1 | 3-1 | 4-1 | C-1 |

Figure 7:
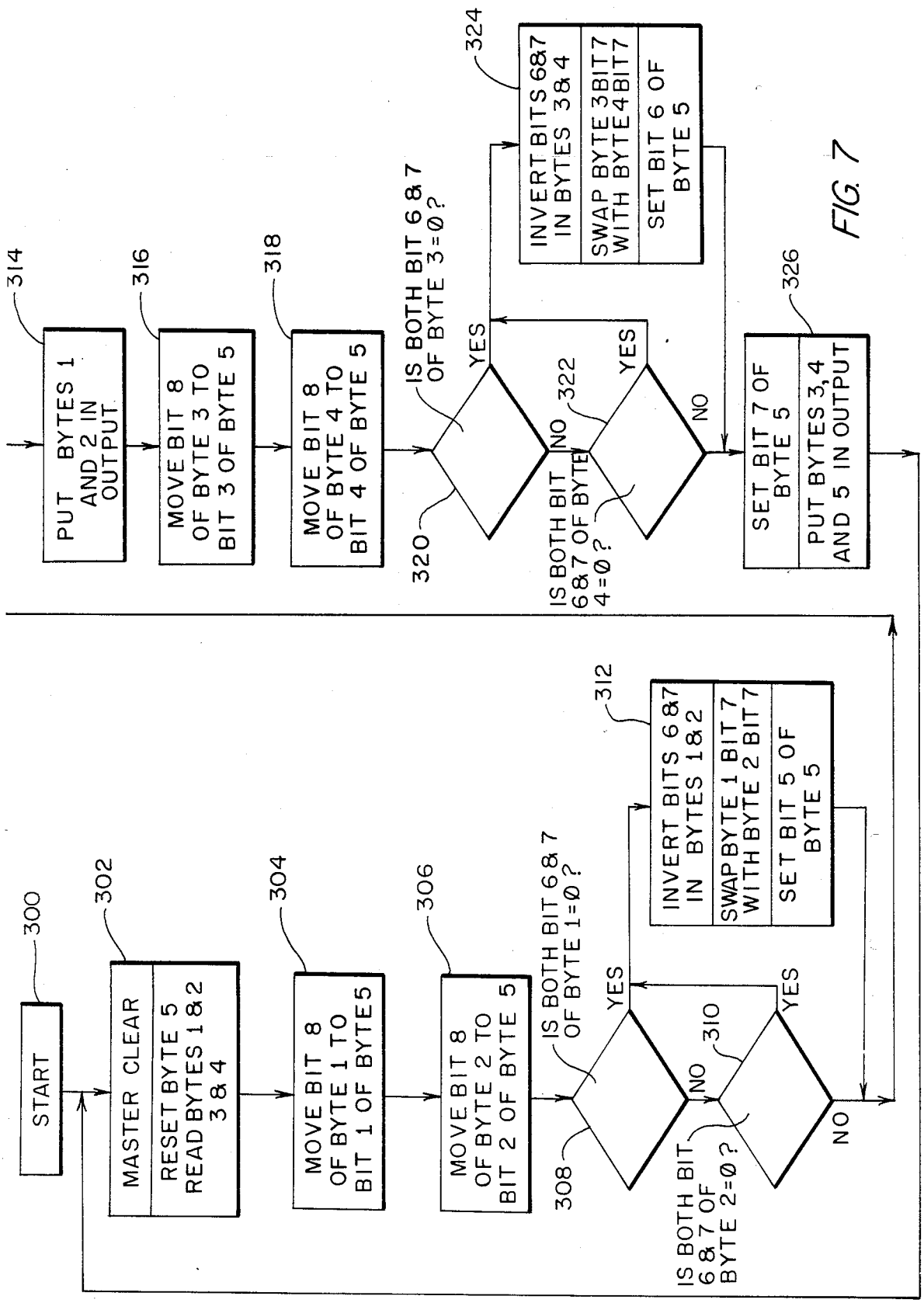
FIG. 7 is a flow chart diagram of the encoding process of a control assembly.

With reference to FIG. 7, the encoding process and operation of the control assembly will now be described. As mentioned above, the present invention can be also implemented in software. While implementing the present invention the hardware has advantages of being faster and not requiring CPU time, system flexibility does permit the operation to be performed by a general purpose digital computer that has been properly programmed. Accordingly, the following process steps of FIG. 7 (and also FIG. 8) can also be used to described the appropriate software needed to implement the present invention with a digital computer.

The flow chart of the encoding process as depicted in FIG. 7 begins with a processing box 300 where the system is started up and the appropriate program is called into the working memory of the computer. From processing box 300, the program proceeds to a processing box 302 where a master clear is performed. The master clear comprises at least resetting byte 5 of the output register and reading in the first four bytes to be processed into an input register. The program then proceeds to processing box 304 where the program causes the value of bit 8 of the first byte to be moved or read into bit No. 1 of byte 5 stored in the output register. The program then proceeds to processing box 306 where the same procedure is performed where bit No. 8 of bit No. 2, namely, the value being written into bit No. 2 of byte No. 5 in the output register. The program then tests, in decision diamond 308 whether both bits 6 and 7 of byte 1 are equal to zero. If both bytes are not equal to zero, then the program proceeds to decision diamond 310 where bits 6 and 7 of byte No. 2 are similarly tested as equally zero. If either test for zero performed in decision diamonds 308 or 310 or positive, the program branches to processing box 312. In processing box 312, the program inverts the values of bits 6 and 7 in both bytes 1 and 2 and swaps bit 7 of byte 1 with bit 7 of byte 2. Finally, the program sets the value of bit 5 of byte 5 in the output register to a 1.

From processing box 312, program returns to the main stream and proceeds to processing box 314 where the converted bytes 1 and 2 are moved to the output register in a corresponding relationship.

The program then essentially repeats all the foregoing steps for bytes 3 and 4 in processing boxes 316 and 318, decision diamonds 320 and 322 and processing boxes 324 and 326. With the completion of the steps performed in processing box 326, the program has now generated five 8 bit bytes of converted code that will be transparent to an ASCII data handling system. From processing box 326, the program returns to processing box 302 where the process is repeated for the next word of 4 bytes of data. The process can repeat the encode cycle for as long as data is available.

Figure 8:
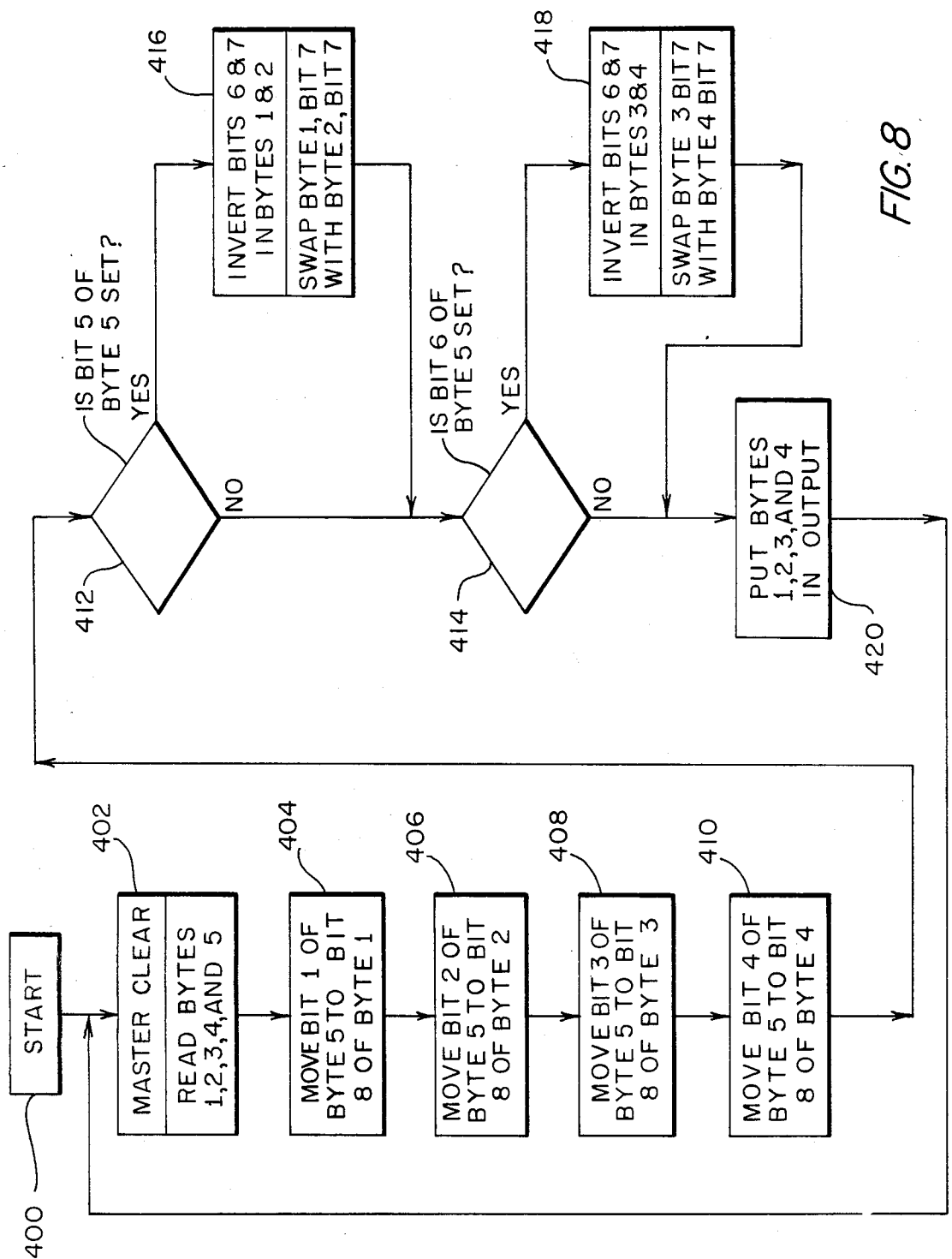
FIG. 8 is a flow chart diagram of the decoding process stage of a control assembly.

With reference now to FIG. 8, the reverse process of taking data that has been encoded and decoding the data back into a binary format as depicted. The reconversion process begins in processing box 400 where the system is started up and proceeds to processing box 402 where the program runs the master clear sequence. The master clear sequence resets all flags associated with the operation and then reads in the first word of 5 bytes of the encoded data. Then the program proceeds through processing boxes 404, 406, 408 and 410 where the program successively moves the first 4 bits of the 5th byte into the corresponding 8th bit positions of the 4 binary bytes of the reconverted data. Stated another way, the program maps bits 1-4 of byte 5 of the converted, input word into bit 8 of bytes 1, 2, 3 and 4 of the output word. The program then proceeds to test, in a decision diamond 412, the value of bit 5 of input byte 5 to determine if bytes 1 and 2 have been altered by the conversion process. In the convention that has been incorporated into the present embodiment, the altered state bytes 1 and 2 is indicated by bit 5 of byte 5 being set, i.e. being a "1." If bit 5 is a zero, the program proceeds to decision diamond 414. Onthe other hand, if bit 5 is a 1, the program branches to processing box 416 where the program inverts bits 6 and 7 of bytes 1 and 2 and then swaps bit 7 of byte 1 with bit 7 of byte 2. The program then returns back to the mainstream from processing box 416 to decision diamond 414. In decision diamond 414, the program goes through the same sequence of steps with respect to bit 6 of byte 5 which affects input bytes 3 and 4. If the program determines that bit 6 is a 1, i e. is set, the program branches to processing box 418 where the program inverts and swaps bits 6 and 7 and bytes 3 and 4 and then proceeds to a processing box 420. In processing box 420, the program transfers the reconverted bytes 1, 2, 3 and 4 to the output and then branches back to begin the process again at processing box 402.

The method and apparatus according to the present invention has now been described with respect a specific embodiment thereof. Modifications and alterations to the present invention would be apparent to those skilled in the art.

We claim:

1. An automatic method for encoding an input word of binary data into an output word, the input word comprised of at least two multibit input bytes comprised in turn of a predetermined number of input bits, the output word comprised of at least the same number of multibit regular output bytes as in said input word, plus an additional multibit output byte, each regular output byte comprised in turn of a predetermined number of output bits arranged into a first group and a second group, said method comprising:

storing an input word into an input register having a parallel output;

automatically transferring unchanged in parallel the information of a first group of predetermined input bits in a predetermined order from each byte to a first group of predetermined output bits of each byte of an output word in an output register having a parallel input;

testing the information of a second group of predetermined input bits that are different from said first group and if said information is of a predetermined value, converting said informtion to a different value;

transferring either said second group of input bits or if a conversion has been done transferring the converted value of said second group of input bits in a predetermined order to a second group of predetermined output bits of the output word in said output register; and transferring data indicative of whether a conversion has been done into said additional byte of said output word in said output register.

2. Apparatus for encoding an input word of binary data into an output word of encoded data, the input word being comprised of at least two multi-bit input bytes, each byte having at least five bits arranged from a Least Significant Bit (LSB) to a Most Significant Bit (MSB), the output word having a predetermined format and being comprised of a plurality of regular output bytes equal in number to the number of said input bytes, each byte having at least five bits arranged from a Least Significant Bit (LSB) to a Most Significant Bit (MSB), said output word also being comprised of an additional output byte, said apparatus comprising:

an input register having a parallel output and comprised of a predetermined plurality of individual input storage cells equal in number and corresponding to the total number of bits in said input word, said input storage cells corresponding to each input byte being grouped into a first plurality of input storage cells for storing a first plurality of bits of that input byte and a second plurality of input storage cells for storing a second plurality of bits of that input byte;

an output register having a parallel input and comprised of a predetermined plurality of individual output storage cells equal in number and corresponding to the total number of bits in each output word, said output storage cells corresponding to each output byte being grouped into a first plurality of output storage cells which correspond to said first plurality of input storage cells and a second plurality of output storage cells which correspond to said second plurality of input storage cells, and a third plurality of output storage cells for storing said additional output byte;

first means for connecting said outputs of said first plurality of input storage cells in the same arrangement to said inputs of said first plurality of output storage cells;

logic means for testing said second plurality of input storage cells of each input byte for having data stored therein with a predetermined pattern of bits; and if true, for manipulating said data stored therein, for presenting said data at a first output thereof, for generating new data indicating said manipulation, and for presenting said new data at a second output thereof;

second means for connecting said logic means first output to said inputs of said second plurality of output storage cells; and third means for connecting said logic means second output to said inputs of said storage cells for said additional output bytes.

3. Converting apparatus as claimed in claim 2 wherein said input storge cells of said input register corresponding to each input byte further includes a third grouping of at least one input storage cell;

wherein said third plurality of output storage cells of said output register are comprised of a first group and a second group of cells, said third connecting means connecting said logic means second output to said inputs of said first group of output cells; and further including a fourth connecting means for connecting said outputs of said third group of input cells to the inputs of said second group of said third plurality of output storage cells.

4. Converting apparatus as claimed in claim 2 wherein said encode logic comprises a first circuit means for determining if data stored in said second plurality of input cells for one of the input bytes are all zeros and if so for generating an enabling signal; and a second circuit means that either passes the value of said data stored in said second plurality of input cells or passes the inverted value of said data depending respectively upon the generation or not of said enabling signal.

5. Converting apparatus as claimed in claim 4 wherein said logic first circuit means comprises a first circuit element and a second circuit element for determining if the data stored in said second plurality of input cells for a first input byte and a second input byte, respectively are all zeros, and a third circuit element for generating said enabling signal if either said first or second circuit elements determine that the data are all zeros; and wherein said second circuit means is comprised of a first section and a second section corresponding respectively to a first input byte and a second input byte, each section for either passing the value or the inverted value of the data stored in said second plurality of input cells corresponding to said first and second input bytes.

6. Converting apparatus as claimed in claim 2 and further including apparatus for decoding an encoded word comprising:

a decoding input register having a parallel output and comprised of a predetermined plurality of individual decoding input storage cells equal in number and corresponding to the total number of bits in said output word which has been encoded, said decoding input storage cells corresponding to each output byte being grouped into a first plurality of decoding storage cells for storing a first plurality of bits of that output byte and a second plurality of input storage cells for storing a second plurality of bits of that output byte and a third plurality of decoding storage cells for storing said additional output byte;

a decoding output register having a parallel input and comprised of a predetermined plurality of individual output decoded storage cells equal in number and corresponding to the total number of bits in each input word, said output decoded storage cells corresponding to each input byte being grouped into a first plurality of output decoded storage cells which correspond to said first plurality of input storage cells and a second plurality of output decoded storage cells which correspond to said second plurality of input storage cells;

fourth means for connecting said outputs of said first plurality of decoding input storage cells in the same arrangement to said inputs of said first plurality of output decoded storage cells;

decoding logic means for testing said second plurality of decoding input storage cells of each said output byte for having data stored therein with a predetermined pattern of bits; and if true, for manipulating said data stored therein and for presenting said data at an output thereof; and fifth means for connecting said decoding logic means output to said inputs of said second plurality of output decoded storage cells.

7. An automatic method for encoding an input word of binary data into an output word of binary data, the input word comprised of at least two multibit input bytes that are each comprised of a predetermined number of input bits which can be grouped into at least a first group and a second group, and the output word comprised of a corresponding number of multibit regular output bytes and comprised of an additional group of output bits, wherein the term byte means a related group of a plurality of bits, said method comprising:

storing an input word into an input register;

automatically transferring in a known order the information of said first group of input bits from each input byte to known locations in an output register that holds said output word;

testing the information of each said second group of input bits from each input byte to determine if such information is a predetermined value, in which case the test results are denoted affirmative;

converting said tested information to a known value if said tested information has said predetermined value;

for each input byte transferring to known locations in said output register either the information of said second group of input bits if said information does not have said predetermined value or information having said converted known value if said information of said second group of input bits does have said predetermined value; and for each input byte transferring data indicative of whether a conversion has or has not taken place into said additional group of output bits, whereby the encoded word is comprised of a first set of encoded bytes each encoded byte including an encoded first group of bits and an encoded second group of bits and an encoded additional group of bits.

8. The automatic method as claimed in claim 7 wherein said first of input bits are contiguous, and wherein said first bit group transferring step transfers the information of said first bit group unchanged in the same order to corresponding bit locations in corresponding bytes in said output register.

9. The automatic method as claimed in claim 8 wherein said first and second input bit groups have the same relative locations in each input byte and said second bit group transferring step transfers either the converted information or the unchanged information to the same relative corresponding location in each output byte.

10. The automatic method as claimed in claim 9 wherein each said input and output byte has eight bits arranged in an order from the least significant bit (LSB) denoted bit 1 to the most significant bit (MSB) denoted bit 8; and wherein said first input bit group of each input byte comprises bits 1 through 5 and said second input bit group of each input byte comprises bits 6 and 7; and further wherein said predetermined value is "00" in binary.

11. The automatic method as claimed in claim 10 wherein said testing step compirses testing said second input bit groups of two input bytes at the same time to determine if either group has a "00" value; and wherein said conversion step comprises inverting the values of all four bits of said second input bit groups; interchanging the value of only one of said tested inverted second group input bits of one of the bytes with one of said tested inverted second group input bits of the other byte.

12. The automatic method as claimed in claim 10 wherein said input word has four 8 bit bytes and said output word stored in said output register has five 8 bit output bytes, four output bytes corresponding to said input bytes and an additional byte, and wherein said transferring step comprises inserting the value of one bit indicative of whether a conversion has occurred in the fifth output byte in an order corresponding to the order of said input bytes.

13. The automatic method as claimed in claim 12 and further including the step of transferring without change the information of the MSB from each input byte in a known order into a predetermined location in said additional output byte of said output register.

14. The automatic method as claimed in claim 7 wherein each said input and output byte has eight bits arranged in an order from the least significant bit (LSB), denoted also bit 1, to the most significant bit (MSB), denoted also bit 8 or the parity bit; and wherein said first input bit group of each input byte comprises bits 1 through 5 and said second input bit group of each input byte comprises bits 6 and 7; and wherein each said input byte is further comprised of a third input bit group that consists of the parity bit; wherein each input word has four bytes and said output word has five bytes, four output bytes that correspond to the four input bytes plus an additional output byte; and wherein each of said corresponding output bytes consists of a first group of output bits consisting of bits 1 through 5, a second group of output bits consisting of bits 6 and 7, and a third group of output bits consisting of the parity bit; and said method further includes transferring the information of said third group of input bits of each input byte in a known order into a predetermined location in said additional output byte of said output register.

15. The automatic method as claimed in claim 14 wherein said testing step comprises testing said second input bit groups of all four input byte Ⓡtesting two input bytes at the same time to determine if either group has said predetermined value, in which case the test results will be affirmative, and if either group has an affirmative test result, then performing said conversion step on both of said transferred second group of input bits.

16. The automatic method as claimed in claim 7 and further including decoding said encoded input word by the following steps:
   a. storing an encoded word into a decoding input register;
   b. transferring in a known order the information of said first encoded group of each encoded byte to known locations in a decoding output register that holds said decoded word;
   c. testing the data in said encoded additional bit group to determine if a conversion of an input byte has been performed and if so decoding the information of the corresponding said second encoded group such that the decoded information is the same as said corresponding second input bit group; and
   for each converted byte transferring either said converted second group of bits or the decoded second group to said decoding output register.

* * * * *